United States Patent [19]

Wang

[11] Patent Number: 5,606,191
[45] Date of Patent: Feb. 25, 1997

[54] SEMICONDUCTOR DEVICE WITH LIGHTLY DOPED DRAIN REGIONS

[75] Inventor: Chih-Hsien Wang, Hsinchu, Taiwan

[73] Assignee: Mosel Vitelic, Inc., Hsinchu, Taiwan

[21] Appl. No.: 422,754

[22] Filed: Apr. 14, 1995

Related U.S. Application Data

[62] Division of Ser. No. 357,486, Dec. 16, 1994, Pat. No. 5,516,711.

[51] Int. Cl.$^6$ .................................................. H01L 27/088
[52] U.S. Cl. ........................ 257/336; 257/344; 257/370; 257/371; 257/408
[58] Field of Search .................................. 257/408, 369, 257/370, 371, 344, 336

[56] References Cited

U.S. PATENT DOCUMENTS

| | | | |
|---|---|---|---|
| Re. 32,800 | 12/1988 | Han et al. | 257/336 X |
| 4,697,333 | 10/1987 | Nakahara | 257/408 X |
| 4,859,620 | 8/1989 | Wei et al. | 257/900 X |
| 5,060,033 | 10/1991 | Takeuchi | 257/344 |
| 5,170,232 | 12/1992 | Narita | 257/336 |
| 5,217,910 | 6/1993 | Shimizu et al. | 437/35 |
| 5,258,319 | 11/1993 | Inuishi et al. | 437/35 |
| 5,334,870 | 8/1994 | Katada et al. | 257/371 |
| 5,349,225 | 9/1994 | Redwine et al. | 257/344 X |
| 5,372,957 | 12/1994 | Liang et al. | 437/35 |
| 5,409,848 | 4/1995 | Han et al. | 437/35 |

FOREIGN PATENT DOCUMENTS

| | | | |
|---|---|---|---|
| 64-64364 | 3/1989 | Japan | 257/344 |
| 5-251697 | 9/1993 | Japan | 257/336 |

OTHER PUBLICATIONS

Wolf, "Process Technology", 1986, *Silicon Processing for the VSLI ERA*, vol. 1, pp. 292–294.

Wolf, "Process Integration", 1990, *Silicon Processing for the VSLI ERA*, vol. 2, pp. 428–434.

*Primary Examiner*—William Mintel
*Attorney, Agent, or Firm*—Townsend and Townsend and Crew LLP

[57] ABSTRACT

A method and structure therefor for the formation of lightly doped drain regions, typically used in the manufacture of a field effect devices. The method includes the steps of providing a semiconductor substrate with a P type well region and an N type well region. Gate electrodes are formed overlying gate dielectric over each P type well and N type well regions. The method then performs a blanket N type implant step at an angle being about 20 degrees and greater from a perpendicular to the gate electrodes into both the P type and N type well regions. The blanket N type implant forms an LDD region in the P type well, and a buried region in the N type well. Sidewall spacers are then formed on edges of the gate electrodes. An N type implant step is then performed on the P type well region to form the source/drain region of a NMOS device. The method then performs two separate P type implants into the N type well, each at different angles and dosages, to form the P type LDD source/drain region for a PMOS device. The PMOS device includes the buried region which acts as a punchthrough stop, typically used to decrease short channel effects.

16 Claims, 9 Drawing Sheets

SEMICONDUCTOR DEVICE WITH LIGHTLY DOPED DRAIN REGIONS

This is a division of U.S. patent application Ser. No. 08/357,486 filed Dec. 16, 1994, now U.S. Pat. No. 5,516,711.

BACKGROUND OF THE INVENTION

The present invention relates to semiconductor integrated circuits and their manufacture. The invention is illustrated in an example with regard to the manufacture of a lightly doped drain (LDD) region of a field effect transistor, and more particularly to the manufacture of a complementary metal oxide silicon field effect (CMOS) transistor, but it will be recognized that the invention has a wider range of applicability. Merely by way of example, the invention may be applied in the manufacture of other semiconductor devices such as bipolar complementary metal oxide silicon field effect (BiCMOS) transistors, among others.

Industry utilizes or has proposed several techniques for the manufacture of an MOS integrated circuit device, and in particularly an LDD region for such device. For example a typical technique to form an N type channel MOS device often includes a step of forming a gate region overlying a P type well region. The P type well region is defined in a semiconductor substrate. A first implant step using the gate region as a mask forms first source and drain regions at low N type concentrations, typically known as LDD regions. The technique then forms sidewall spacer structures on the gate edges. A second implant step using the gate region and sidewall spacer structures as a mask provides higher concentrations of N type ions into the source and drain regions, thereby forming the MOS device having the LDD structure.

A limitation with the typical N type channel MOS device with LDD structure includes hot electron injection effects when some electrons inject into the gate oxide beneath sidewall spacers. The typical n-type channel. MOS (NMOS) LDD structure often locates more of the N− type region outside the gate electrode, that is, a greater portion of the N− type region is underneath the sidewall spacers, rather than directly beneath the gate electrode. When voltage at the gate electrode turns the device on, hot electrons inject into sidewall spacer region, often increasing the resistance in the N− type regions directly beneath such sidewall spacers. This tends to cause the N− type regions underneath the sidewall spacers to "pinch off" by way of the higher resistance in the N− type region.

Another limitation exists by the use of the LDD structure in a typical P type channel depletion mode metal oxide silicon (PMOS) field effect device. The PMOS device uses a P type buried channel structure and P type source and drain regions. As the channel length becomes shorter in the typical PMOS device, short channel effects such as punchthrough and others tend to occur. Punchthrough typically shorts the PMOS source and drain regions together, thereby rendering the device partially inoperative. In addition, when the source and drain regions become implanted with an impurity having a high diffusion co-efficient such as boron or the like, lateral diffusion of such impurities also tends to be another cause of the punchthrough phenomenon.

A further limitation in the fabrication of LDD structures, and particularly for CMOS type devices is the high quantity of main mask steps, typically at least five to merely form both NMOS and PMOS devices up to the LDD structures. Each masking step often increases work-in-process time for the semiconductor product. An increase in work-in-process time generally corresponds to a longer product turn-around-time, typically measured from wafer start to final test. Longer product turn-around-time is typically an undesirable consequence for the manufacture of CMOS devices and often translates into higher costs in manufacture, and the like.

Still further, it is often desirable to reduce defects in the wafer introduced during its processing. Wafer fabrication processes such as masking, exposing, developing, etching, and others typically introduce particles into the integrated circuit. These particles often contribute to the amount of defective integrated circuit chips. Generally, more masks used in a semiconductor process tend to contribute to more defective integrated circuit chips. For example, a conventional CMOS process relies on at least five separate masks to form the LDD and source/drain regions for NMOS and PMOS devices. As industry attempts to increase the yield of good integrated circuit chips on a wafer, it is often desirable to reduce the number of masks (or masking steps) used during wafer manufacture.

From the above it is seen that a method of fabricating semiconductor LDD structure that is easy, reliable, faster, cost effective, and is often desired.

SUMMARY OF THE INVENTION

The present invention provides a method and resulting integrated circuit device, and in particular a CMOS integrated circuit device having a fabrication method and structure therefor for an improved lightly doped drain region. The present LDD fabrication method relies upon lens masking steps, and provides a resulting structure that reduces short channel effects in a PMOS device and hot electron effects in an NMOS device, both of which typify CMOS technology.

In a specific embodiment, the present invention provides a method of forming a semiconductor integrated circuit. The present method includes the steps of providing a semiconductor substrate having a first well region of a first conductivity type, and a second well region of a second conductivity type. The present method also includes forming first gate electrode overlying gate dielectric on the first well region and second gate electrode overlying gate dielectric on the second well region. A step of implanting first impurities at a first implant angle into the first well region and the second well region which are adjacent to the first gate electrode and adjacent to the second gate electrode, respectively, is also provided. The first implant step uses impurities of the second conductivity type and is at a first dose. Sidewall spacers are then formed on edges of the first gate electrode and the second gate electrode.

The method further includes implanting second impurities at a second angle into the first well region which is adjacent to the first gate electrode. The second implant uses impurities of the second conductivity type and is at a second dose, typically greater than the first dose. A step of implanting third impurities at a third angle into the second well region which is adjacent to the second gate electrode is also provided. The second implant step uses impurities of the first conductivity type and is at a third dose. Further, a fourth step of implanting impurities at a fourth angle into the second well region, adjacent to the second gate electrode, is also provided. The fourth implant step uses impurities of the first conductivity type and at a fourth dose, often different from the third dose.

An alternative embodiment provides a semiconductor integrated circuit device which includes a first well region having first conductivity type impurities and a second well region having second conductivity type impurities. The first well region has a first gate electrode formed overlying gate dielectric on the first well region. First sidewall spacers are formed on the first gate electrode. The first well region also includes a first source/drain region which has a first LDD region formed adjacent to the first gate electrode. The first LDD region includes a portion underlying the first gate electrode and a portion underlying the first sidewall spacers. The first LDD region portion underlying the first gate electrode is longer than the first LDD portion underlying the first sidewall spacers.

The second well region includes a second gate electrode formed overlying gate oxide on the second well region. The second gate electrode includes second sidewall spacers formed thereon. The second well region also includes a second source/drain region which has a second LDD region and a pocket region formed adjacent to the second gate electrode.. The second LDD region includes a portion underlying the second gate electrode and a portion underlying the second sidewall spacers. The pocket region is formed under the second LDD portion underlying the second gate electrode. The second LDD region portion underlying the second gate electrode is often longer than the second LDD portion underlying the second sidewall spacers.

A further alternative embodiment includes a method of fabricating a CMOS integrated circuit device. The present embodiment includes steps of providing a partially completed semiconductor substrate which includes a P type well region, an N type well region, a gate oxide layer overlying the P type well region and the N type well region, a first gate electrode over the P type well region, and a second gate electrode over the N type well region. The present method also includes implanting first N type impurities, at an angle being about 20 degrees and greater relative to a perpendicular to the first gate electrode and the second gate electrode, into the P type well region and the N type well region. This implant step penetrates regions beneath the first gate electrode and the second gate electrode, and forms a buried region at the N type well region and an LDD region at the P type well region. Sidewall spacers are formed on edges of the first gate electrode and the second gate electrode.

The present method also implants second N type impurities into the P type well region at an angle being about 7 degrees and less from a perpendicular to the first gate electrode. The second N– type implant is at a greater dose then the first N type implant. Steps of implanting first P type impurities at an angle being about 7 degrees and less from a perpendicular to the second gate electrode, and implanting second P type impurities at an angle being about 20 degrees and greater also from a perpendicular to the second gate electrode are also provided. The second P type implant is at a lower dose than the first P type implant and penetrates a region beneath the second gate electrode.

The present invention achieves these benefits in the context of known process technology. However, a further understanding of the nature and advantages of the present invention may be realized by reference to the latter portions of the specification and attached drawings.

DESCRIPTION OF THE SPECIFIC EMBODIMENT

Prior Art LDD Structures

Figure 1:
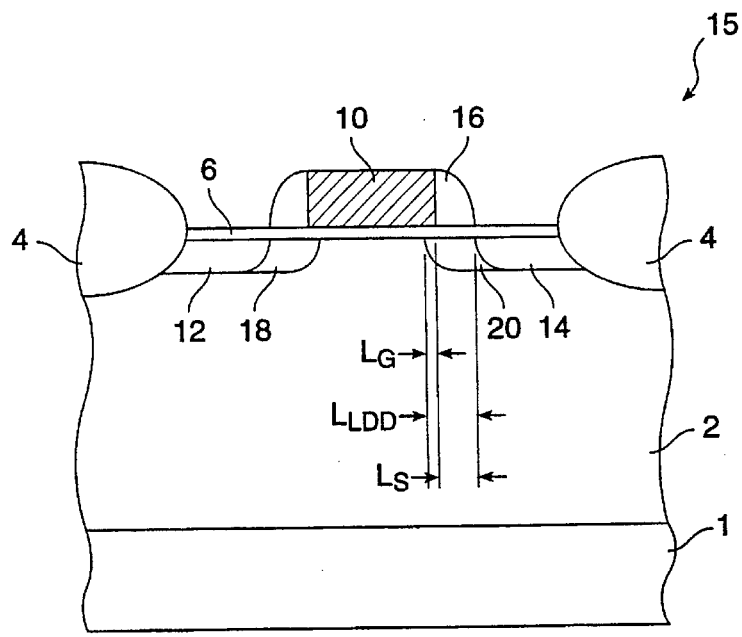
FIG. 1 is a simplified cross-sectional view of a conventional LDD region in an N type channel MOS device.

FIG. 1 is a simplified cross-sectional view of a typical LDD region in an N type channel MOS device 15. The MOS device includes a P type well region 2 which is defined on a semiconductor substrate 1. The MOS device also defines field oxide regions 4, typical formed by a technique known as the local oxidation of silicon (LOCOS) and often used to isolate and/or separate adjacent devices from each other. A gate oxide region 6 is formed over the P type well region 2, and a gate electrode region 10 is formed overlying the gate oxide region 6. The MOS device also defines a portion ($L_G$) of the N– type LDD region 18, 20 underneath the gate electrode region 10. But another portion ($L_S$) of the N– type LDD region 18, 20 is defined outside the gate electrode region 10. Sidewall spacers 16 are formed at edges of the gate electrode region 10. N+ type source/drain regions 12, 14 are defined typically within the perimeter of N– type LDD regions 18, 20. The combination of the N– type and N+ type regions define the source and drain regions of the MOS with the typical LDD structure.

Switching the MOS device 15 often occurs by applying a voltage to the gate electrode. The voltage at the gate electrode forms an N type channel of conductive material underneath the gate electrode 10. The N type channel connects the source/drain region 12 with the source/drain region 14, thereby switching the device to an "ON" state. Alternatively, when no voltage is applied to the gate electrode, P type material isolates source/drain region 12 from source/drain region 14.

The typical MOS device of FIG. 1 includes the LDD structure which improves the hot electron injection problem over a device without the LDD structure. But the typical MOS device is still often plagued by such hot electron injection problem as device dimensions become smaller. For example, the N– type LDD structure length can be represented by the length $L_{DD}$, typically extending from a region directly underneath the gate electrode to an outside edge of the sidewall. A larger portion $L_S$ of the N– type LDD structure underlies the sidewall instead of the portion $L_G$ underlying the gate electrode. As discussed, this structure injects hot electrons into sidewalls overlying the N– type LDD region, thereby decreasing the driving current of the device.

The MOS device of FIG. 1 defines an active region of a typical semiconductor chip. An active area of the chip often includes hundreds, thousands, or even millions of these microscopically small regions, each defining an active device. Of course, the particular use of the MOS device depends upon the particular application.

Prior Art LDD Fabrication Methods

A simplified prior art LDD fabrication method for a CMOS device may be briefly outlined as follows.

(1) Provide a semiconductor substrate.
(2) Form field oxide by use of the LOCOS technique.
(3) Form P type wells and N type wells.

(4) Grow gate oxide layer.

(5) Implant buried channel regions for threshold voltage adjustment.

(6) Deposit gate polysilicon layer (or poly 1 layer) and dope.

(7) Mask 1: Define gate polysilicon layer to form polysilicon gate regions.

(8) Mask 2: Define N− type LDD regions and implant.

(9) Mask 3: Define P− type LDD regions and implant.

(10) Form sidewall spacers on polysilicon gate regions.

(11) Mask 4: Define N+ type source/drain regions and implant.

(12) Mask 5: Define P+ type source/drain regions and implant.

(13) Anneal.

(14) Perform other fabrication steps.

The simplified fabrication method of the LDD structure relies upon at least five masks including Masks 1, 2, 3, 4, and 5, and at least four implant steps to form the desired LDD source/drain regions. It is often desirable to reduce the number of masks in use for a particular fabrication process. Furthermore, it is also desirable to reduce defects caused by the amount of masks or masking steps. FIGS. 2–10 illustrate further details of each of the fabrication steps briefly outlined.

Figure 2:
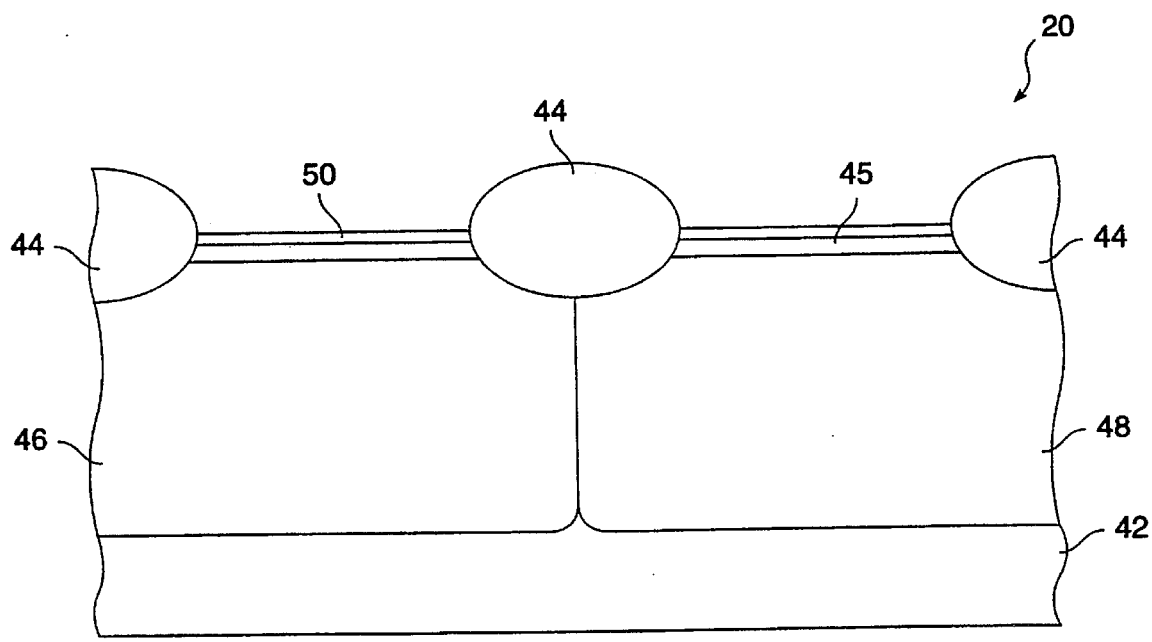
FIGS. 2–10 illustrate a conventional method of fabrication for the LDD structure in a CMOS device.

FIG. 2 illustrates a simplified cross-sectional view of a partially coupled CMOS device 20 which includes a semiconductor substrate 42, typically the starting point for the fabrication process. Field oxide regions 44 form onto the semiconductor substrate by use of a technique such as the local oxidization of silicon (LOCOS), and the like. In this CMOS example, P type well region 46 and N type well region 48 are defined onto the semiconductor substrate 42, typically separated by the field oxide region 44. The P type well region 46 and N type region define the locations for an N type channel device (NMOS) and a P type channel device (PMOS), respectively.

A gate oxide layer 50 is grown overlying both the P type and N type well regions. The gate oxide region is typically a thin layer of oxide. A step of ion implanting P type conductivity impurities defines the buried region 45, often used to adjust the threshold voltage of each of the devices. The buried region is of P type conductivity.

Figure 3:
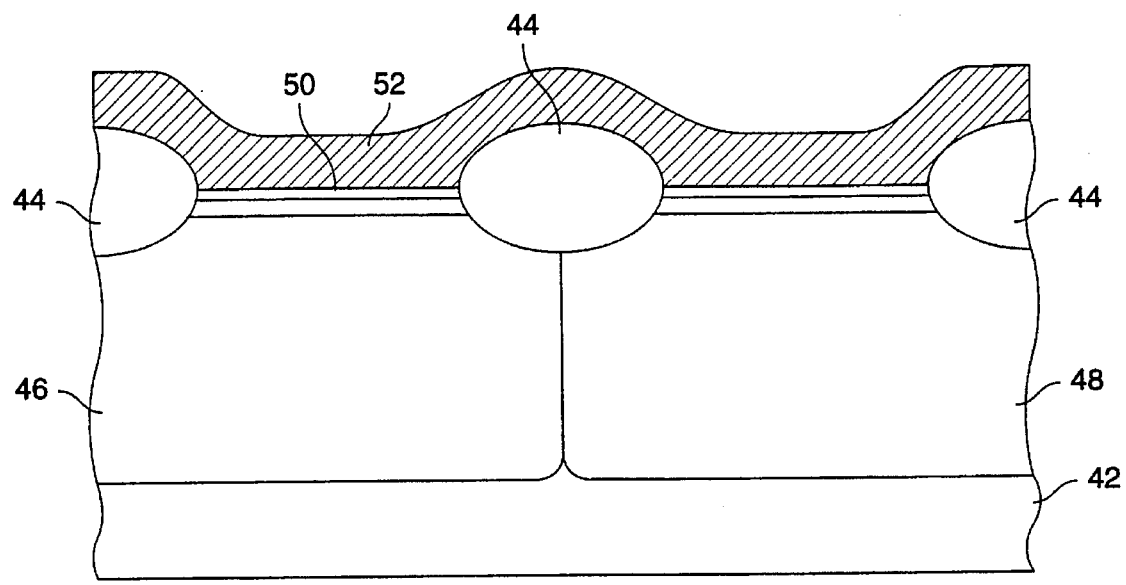

The cross-sectional view of FIG. 3 illustrates a gate polysilicon layer 52 formed overlying the surface of the partially completed device of FIG. 2. The gate polysilicon layer is also known as the poly 1 layer and the like. The gate polysilicon layer is often doped with an N type dopant and others.

Figure 4:
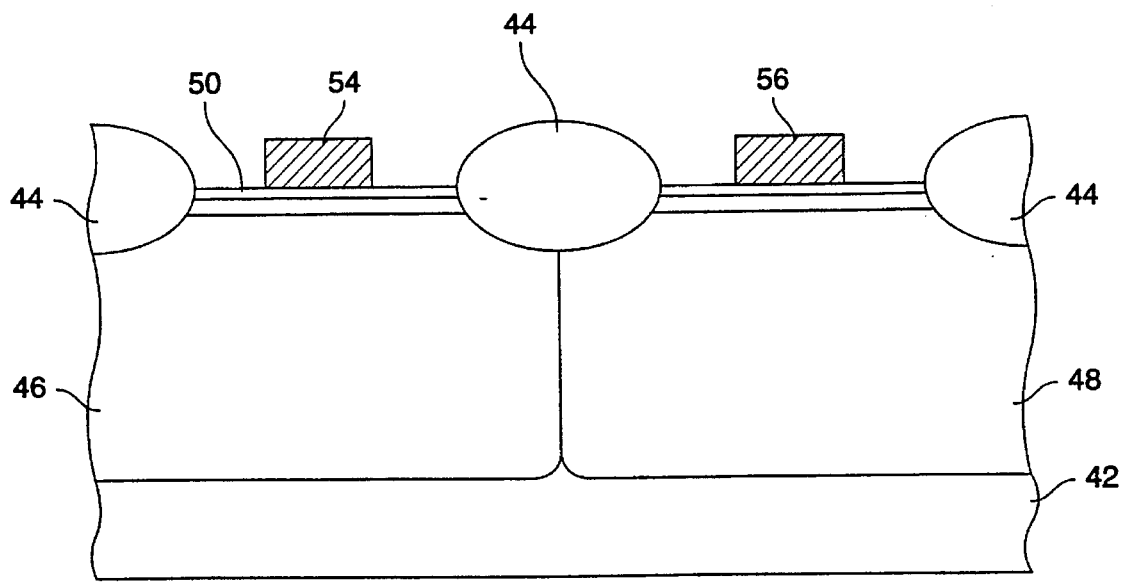

A masking step forms gate polysilicon regions 54 and 56 of FIG. 4 defined from the gate polysilicon layer 52. In particular, the gate polysilicon region (or gate electrode region) is often formed by standard process steps such as masking, exposing, developing, etching, and others. The gate oxide layer typically acts as an etch stop during the etching step, and often remains overlying both the N type and P type well regions. As illustrated, the gate electrode regions include edges having substantially vertical sides.

Figure 5:
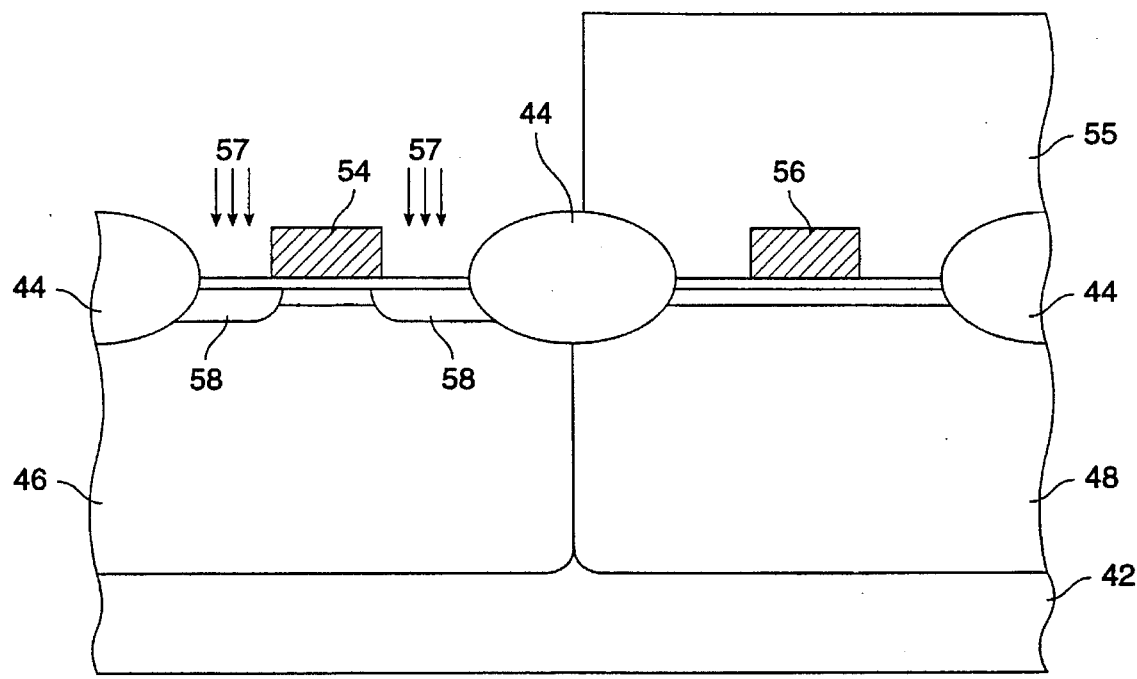
Figure 6:
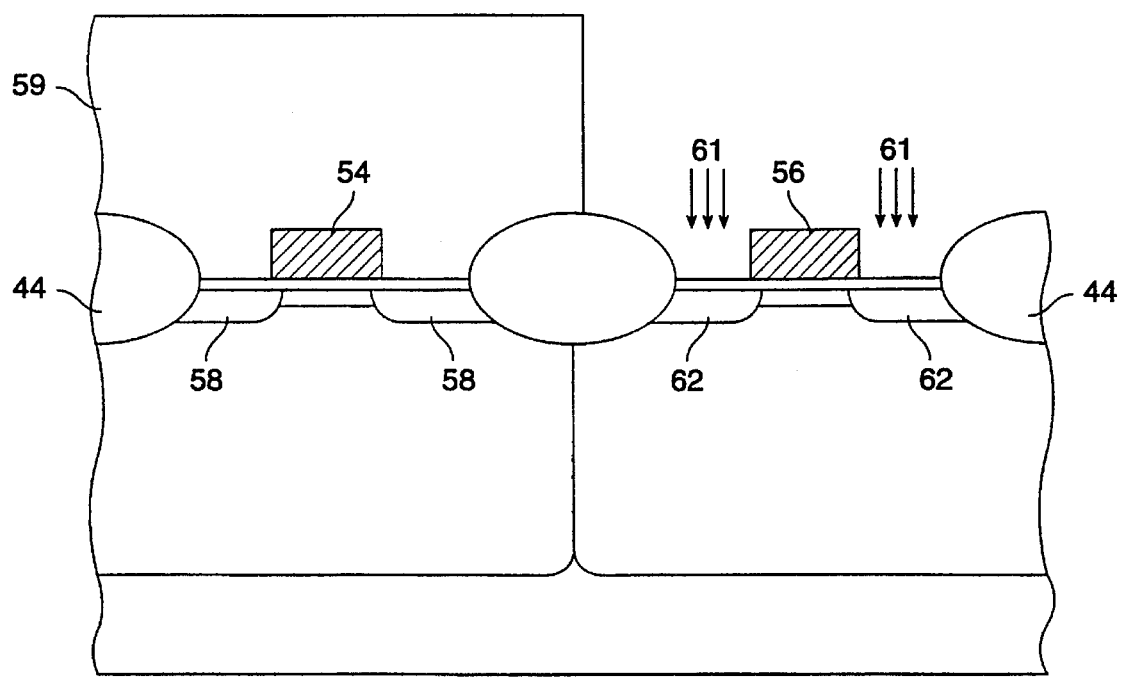

FIGS. 5 and 6 illustrate the LDD implant for both the N− and P− type LDD regions. A mask 55 typically photoresist overlying the top surface of the N type well region exposes the P type well region for the N− type LDD implant 57. The N− type implant forms the N− type LDD regions 58 for the NMOS device. The mask 55 is then stripped by way of standard techniques known in the art. Another mask 59 exposes the N type well region for the P− type LDD implant 61. The P− type implant forms the P− type LDD regions 62 for the PMOS device. The NMOS and PMOS devices typify the CMOS process. Mask 59 is then stripped.

Figure 7:
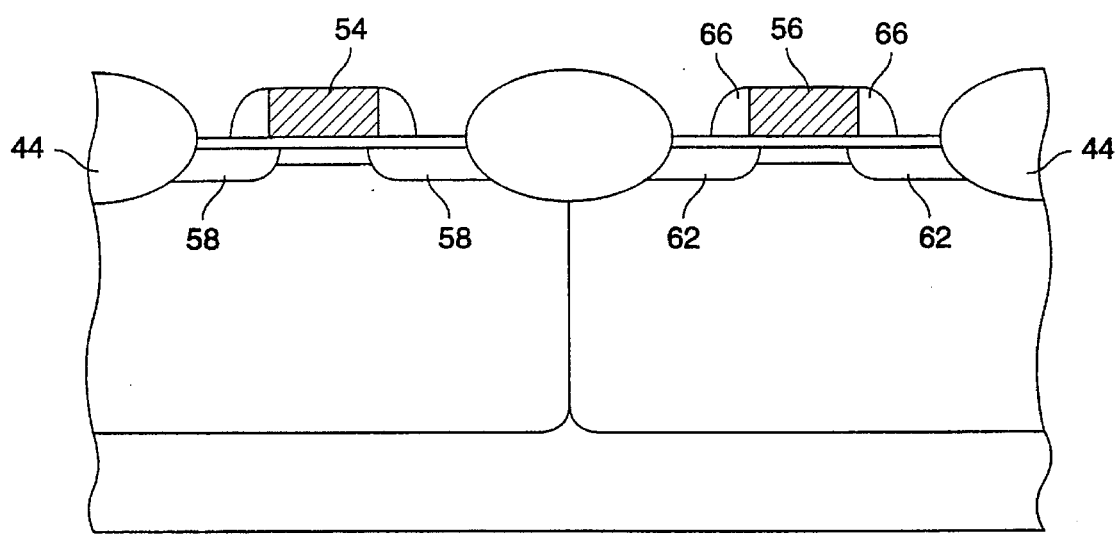

The CMOS process forms sidewall spacers 66 on each of the gate electrodes 54, 56 as illustrated by FIG. 7. The sidewalls are formed by any suitable method known in the art. As illustrated, a greater portion of the LDD region underlies the sidewall spacer region than the gate electrode region. This typical LDD structure often contributes to the hot electron injection problem.

Figure 8:
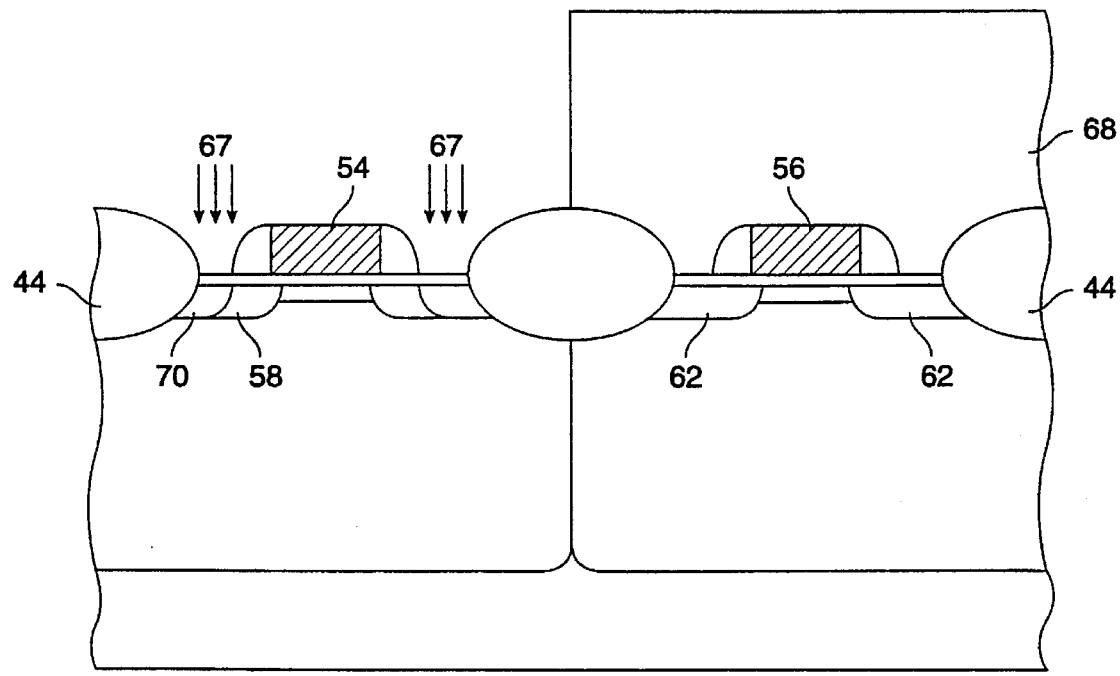
Figure 9:
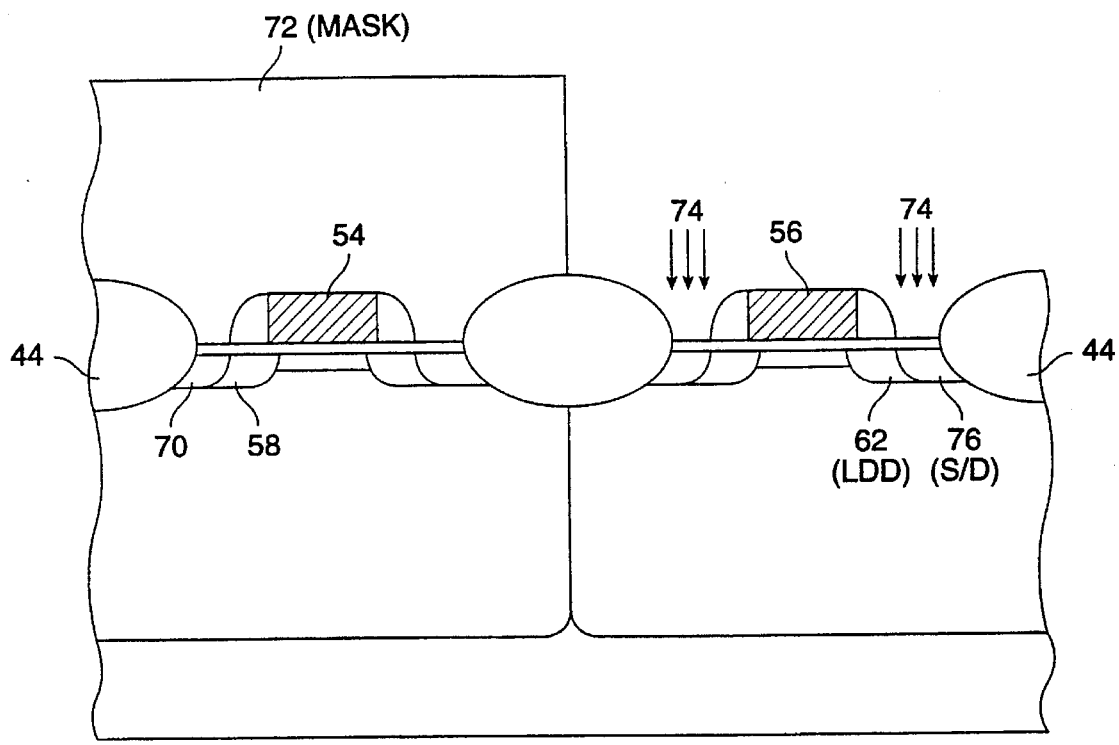
Figure 10:
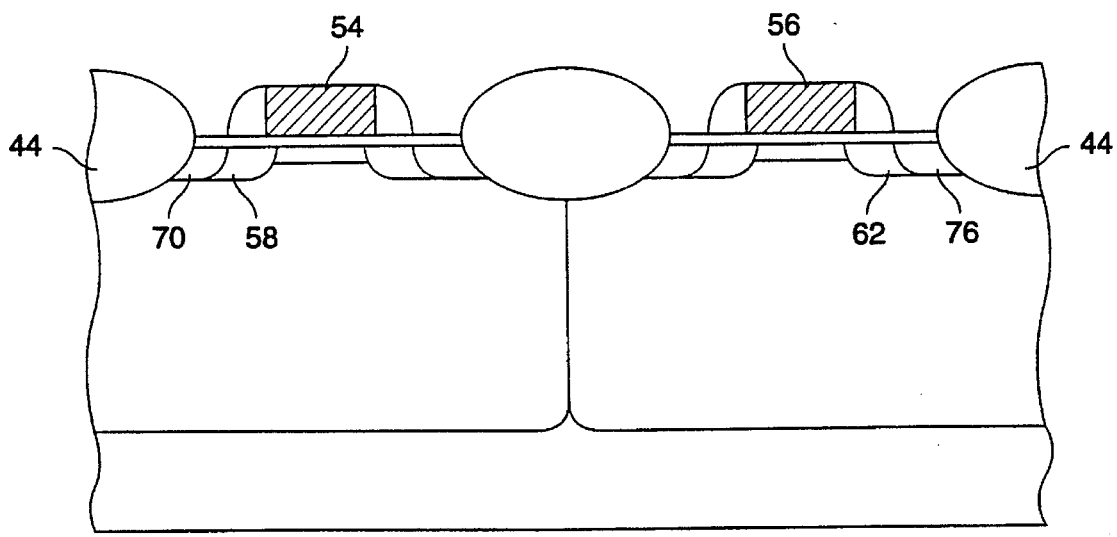

FIGS. 8 and 9 illustrate the method of forming the source/drain regions 7C, 76 for both the NMOS and PMOS devices. A mask 68 exposes the regions for the NMOS source/drain implants, typically an N+ type implant 67 as illustrated by FIG. 8. Mask 68 is stripped by way of any known technique, and another mask 72 exposes the regions for the PMOS source/drain implants, typically a P+ type implant 74 as illustrated by FIG. 9. Mask 72 is stripped. The final LDD structure in the typical CMOS example is illustrated by FIG. 10.

Present LDD Embodiments

Figure 11:
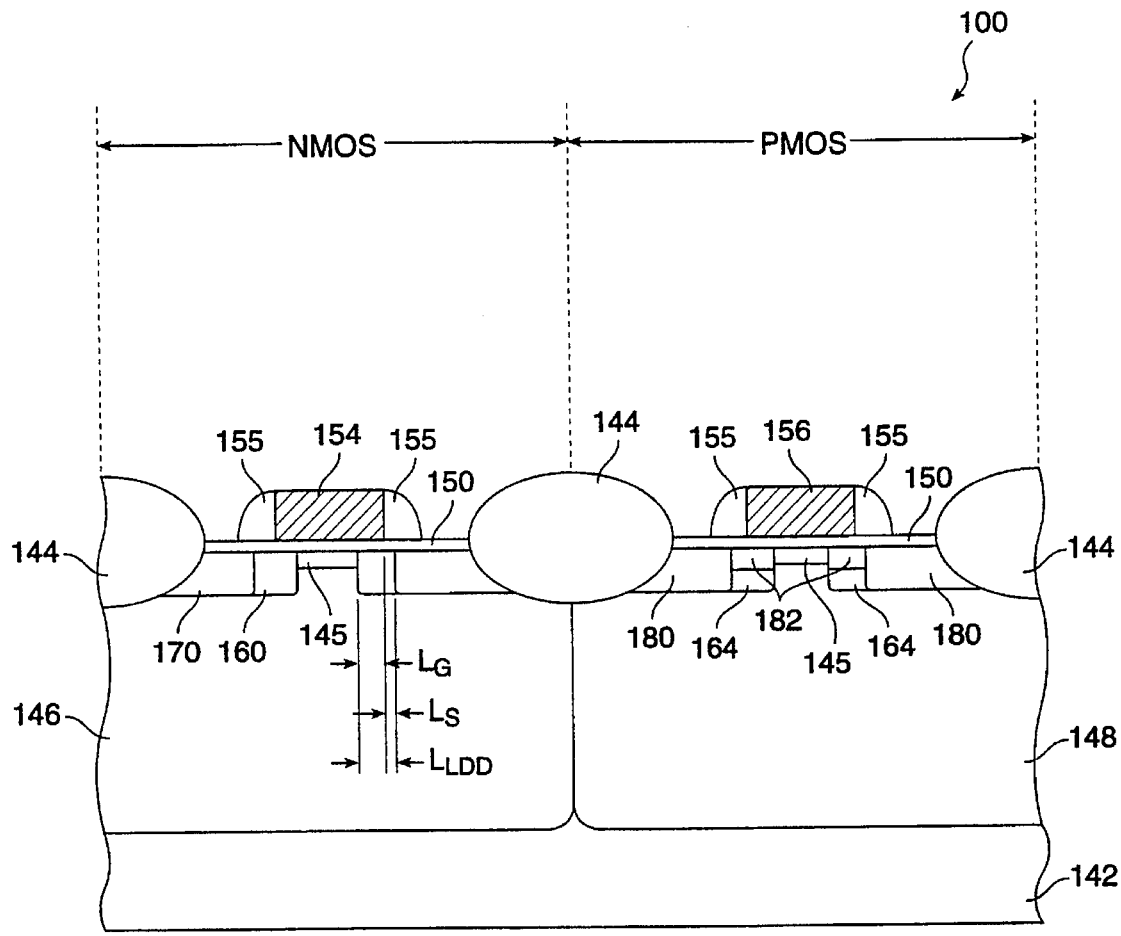
FIG. 11 is a cross-sectional view of an embodiment of the present LDD structure.

FIG. 11 is a cross-sectional view of an embodiment 100 of the present LDD structure in a CMOS integrated circuit device. The present LDD structure includes an NMOS device and a PMOS device, typifying the CMOS technology, in semiconductor substrate 142. These devices are each separated by a field oxide isolation region 44. The NMOS device has elements such as N− type LDD regions 160, N+ type source/drain regions 170, and threshold implant region (or channel region) 145, all formed in a P type well region 146. The NMOS device also includes a gate electrode 154, gate oxide layer 150, sidewall spacers 155, and the like. It should be noted that the length $L_G$ of the N− type LDD region underlying the gate electrode 154 is greater than the length $L_S$ of the LDD region underlying the sidewall spacer 155. This structure tends to reduce the hot electron injection problem of the prior art by positioning the LDD region substantially under the gate electrode, instead of the sidewall spacers.

The PMOS device includes elements such as P+ type source/drain regions 180, P− type LDD regions 182, punchthrough stoppers 164, and threshold implant region 145, all formed within an N type well region 148. The device also has a gate electrode 156, sidewall spacers 155, gate oxide layer 150, and the like. To prevent short channel effects, the present CMOS embodiment includes the punchthrough stopper regions 164, often preventing the lateral diffusion of the source/drain impurities. In addition, the length $L_G$ of the P− type LDD region $L_{LDD}$ underlying the gate electrode is often larger than the length $L_S$ of such region underlying the sidewall spacers, thereby reducing the amount of hot electrons injected into the sidewall spacers.

The embodiment 100 of FIG. 11 includes a channel width for NMOS devices at about 0.35 μm and less. At these dimensions, the $L_{LDD}$ is at a length ranging from about 0.1 μm to about 0.15 μm, and preferably about 0.12 μm, and $L_G$ is at a length ranging from about 0.08 μm to about 0.1 μm, and preferably about 0.09 μm, and $L_S$ is at a length ranging from about 0.02 μm to about 0.05 μm, and preferably about 0.03 μm.

The embodiment 100 of FIG. 11 also includes a channel width for PMOS devices at about 0.4 μm and less. At these dimensions, the $L_{LDD}$ is at a length ranging from about 0.15

μm to about 0.2 μm, and preferably about 0.17 μm, and $L_G$ is at a length ranging from about 0.105 μm to about 0.125 μm, and preferably about 0.115 μm, and $L_S$ is at a length ranging from about 0.045 μm to about 0.075 μm, and preferably about 0.055 μm. Of course, the dimensions used for each particular device depends upon the particular application.

Present LDD Fabrication Embodiments

An embodiment of the present LDD fabrication method for a CMOS device may be briefly outlined as follows.

(1) Provide a semiconductor substrate.

(2) Form field oxide by use of the LOCOS technique.

(3) Form P type wells and N type wells.

(4) Grow gate oxide layer.

(5) Implant buried channel region for threshold voltage adjustment.

(6) Deposit gate polysilicon layer (or poly 1 layer) and dope.

(7) Mask 1: Define gate polysilicon layer to form polysilicon gate regions.

(8) Blanket angle ion implant N– type impurities to define the N– type LDD regions in NMOS regions and punchthrough stopper regions in PMOS regions.

(9) Form sidewall spacers on the polysilicon gate regions.

(10) Mask 2: Define N+ type source/drain regions on the NMOS regions and ion implant N+ type impurities.

(11) Mask 3: Define P– type LDD and P+ type source/drain regions on the PMOS regions, and angle implant P– type LDD regions and angle implant P+ type source/drain regions.

(12) Anneal.

(13) Perform remaining fabrication steps.

The embodiment of the present LDD fabrication method includes the use of at least three masks, Mask 1, 2, and 3, to form the LDD structures. By way of less masking steps, the present LDD fabrication method provides a more simplified method which often takes less time to process than the prior art method as described above. Less time in processing often corresponds to faster turn-around-time and more efficient processing.

FIGS. 12–18 illustrate an embodiment of a fabrication method for the present LDD structure in a CMOS device. The embodiment of FIGS. 12–18 is shown for illustrative purposes only, and therefore should not limit the scope of the invention recited by the claims. Furthermore, the method depicted by the FIGS. 12–18 is not necessarily to scale unless indicated otherwise.

Figure 12:
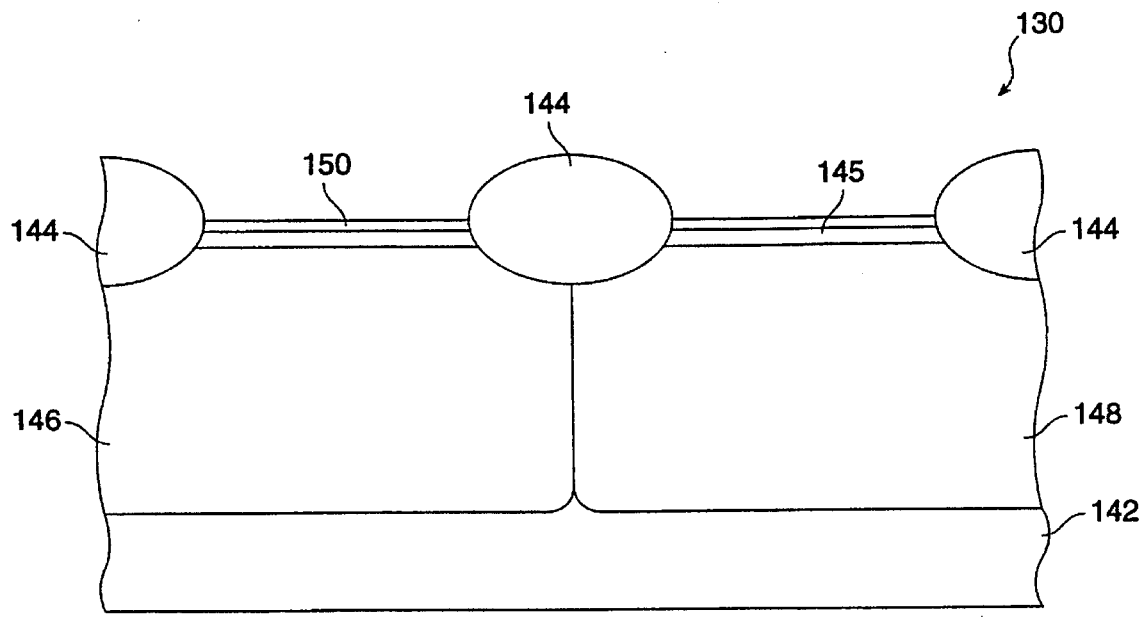
FIGS. 12–18 illustrate an embodiment of a fabrication method for the present LDD structure in a CMOS device.

FIG. 12 illustrates a partially completed semiconductor integrated circuit device 130. The partially completed device includes a semiconductor substrate 142, and field isolation oxide regions formed thereon by use of a technique such as the local oxidation of silicon (LOCOS) or the like. LOCOS is typically used as a starting point for providing regions on the substrate used for device fabrication.

The substrate also includes P type well region 146 and N type well region 148, typifying the CMOS process. An NMOS device and PMOS device will be defined onto the P type well region 146 and N type well region 148, respectively. Alternatively, the well regions may be N type and P type depending upon the particular application.

A gate oxide layer 150 is formed overlying the top surface of both the P type and N type well regions. The gate oxide layer 150 is a high quality oxide, and is also typically thin to promote for efficient switching of the device. The thickness of such gate oxide layer typically ranges from about 7 to about 9 nm and preferably about 8 nm.

Impurities for the buried channel layer 145 are typically implanted into and preferably through the thin layer of oxide overlying the substrate. The thin layer of oxide acts as a "screen" and often protects the underlying single crystal silicon from excessive damage caused by the implant. The impurities for the buried channel layer may either be N type or P type, depending upon the particular application. In this CMOS example, the impurities are P type, and at a concentration ranging from about $10^{17}$ and $10^{18}$ atoms/cm$^3$ and preferably at about $5\times10^{17}$ atoms/cm$^3$. Of course, the concentration used provides for the desired threshold voltage characteristics for the NMOS and PMOS devices.

Figure 13:
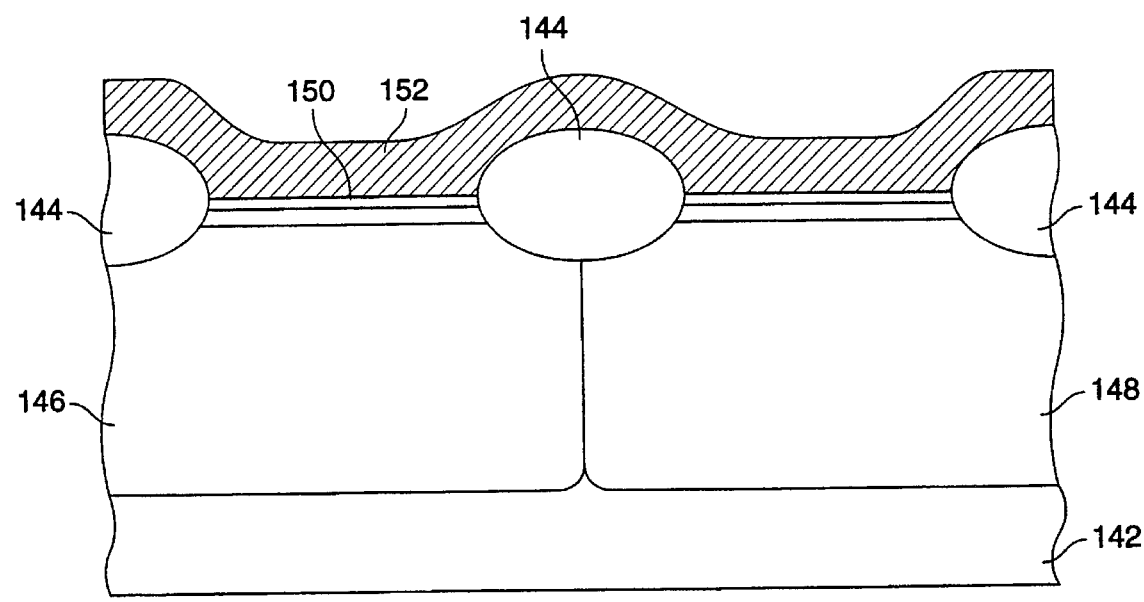

A polysilicon layer 152 is formed over the oxide layer as illustrated by FIG. 13. The thickness of the polysilicon layer 152 ranges from about 2,500Å to about 3,500Å, and preferably at about 3,000Å. The polysilicon layer is also typically doped with an N type impurity at a concentration from about $3\times10^{20}$ to $6\times10^{20}$ atoms/cm$^3$, and preferably at about $5\times10^{20}$ atoms/cm$^3$. Of course, the thicknesses of the oxide layer and polysilicon layer depend upon the particular application.

Figure 14:
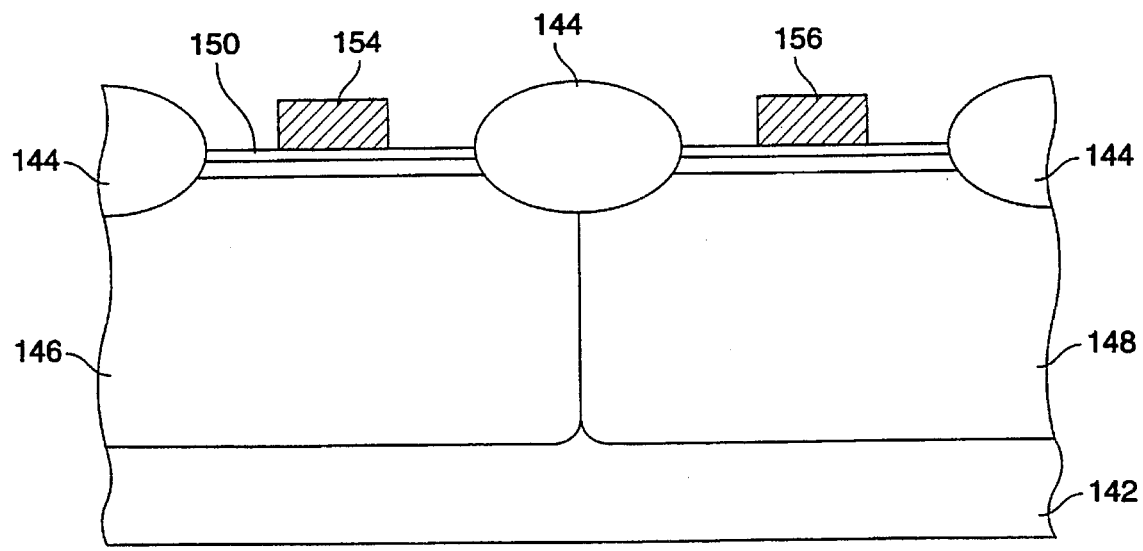

The polysilicon layer 152 of FIG. 13 is defined to form the polysilicon gate electrodes 154 and 156 of FIG. 14. The gate electrodes are often formed by any suitable series of photolithographic steps such as masking, developing, etching, and others. Each gate electrode includes edges having substantially vertical features, but may also have features which are not substantially vertical. The exact geometry for each gate electrode will depend upon the particular application.

Figure 15:
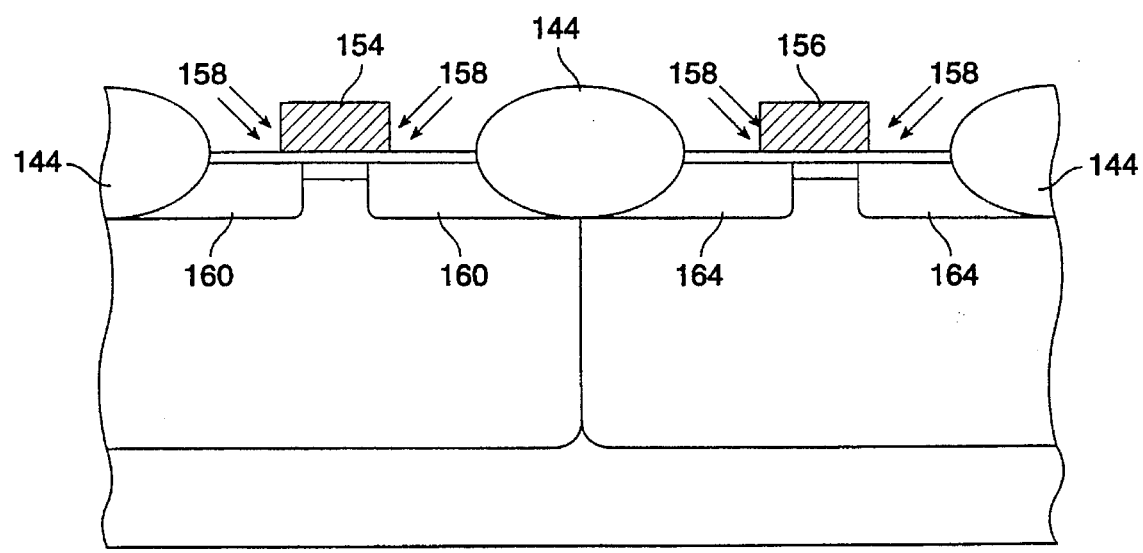

Each gate electrode is then used as a mask to blanket implant impurities 158 into a portion of the wells to form the N– type LDD regions 160, 164 of FIG. 15. The N– type implant is typically performed at a dose ranging from about $1\times10^{13}$ atoms/cm$^2$ and $5\times10^{13}$ atoms/cm$^2$, and preferably at about $3\times10^{13}$ atoms/cm$^2$. The angle at which the implant takes place ranges from angles greater than about 20 degrees, and preferably about 30 degrees to about 45 degrees from a line perpendicular to the channel direction. The implant at such angles may be defined as a "large-tilt-angle" ion implant. The implant occurs on both the source and drain side of each gate electrode region as illustrated by FIG. 15. Optionally, the implant can also be performed from other perspectives relative to the gate electrode region, and may even be performed at all edges of each gate electrode. Though the embodiment of FIG. 15 illustrates an N– type implant, the implant may also be a P– type implant, among others. Of course, the implant type, dose, angle, and location depend on the particular application.

Figure 16:
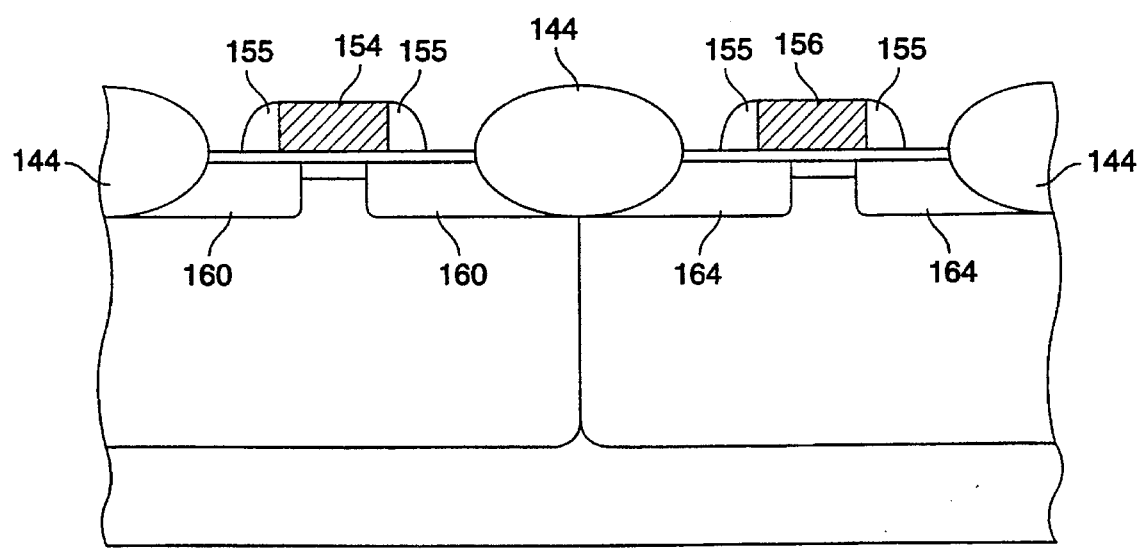

FIG. 16 illustrates sidewall spacers 155 formed on the edges of each polysilicon gate electrode region. The sidewall spacers 155 are typically formed by the steps of depositing a layer of dielectric material, densifying such layer, and removing horizontal surfaces of such layer. The layer of dielectric material such as silicon dioxide, silicon nitride, combinations thereof, and the like is formed over the surface of the partially completed device structure of FIG. 15. The step of densifying such dielectric material seals the polysilicon gate electrode 154 and 156 from an overlying layer, often a dielectric material such as silicon dioxide, silicon nitride, combinations thereof, and the like.

An anisotropic etching step is often performed on the densified dielectric larger to form the sidewall spacers 155. The anisotropic etching step substantially removes the horizontal surfaces of the dielectric material and leaves sidewall spacers. Either reactive ion etching, plasma etching, or the like is often used to provide the desired anisotropic characteristics.

Figure 17:
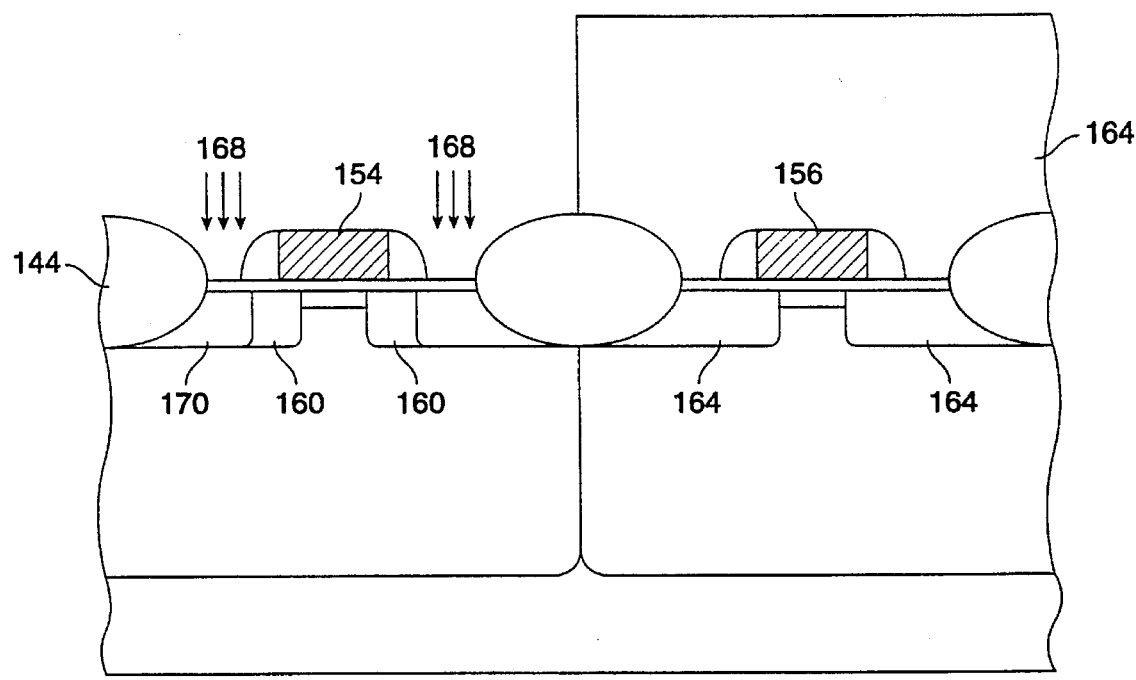
Figure 18:
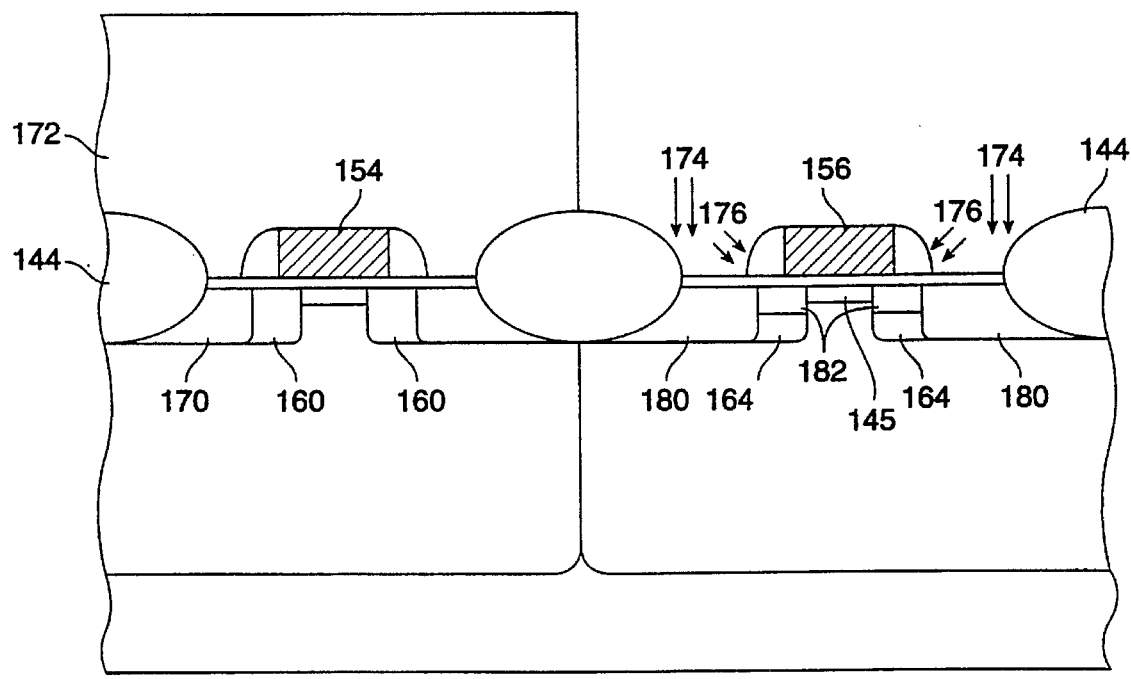

A mask typically photoresist 165 protects the regions defined for the PMOS devices, and exposes source/drain regions for the N+ type source/drain implant as illustrated by FIG. 17. A typical implant process forms the N+ type source/drain region 170. This implant step relies upon a dose of N+ type impurities ranging from about $3 \times 10^{15}$ atoms/cm$^2$ and about $5 \times 10^{15}$ atoms/cm$^2$, and preferably at about $4 \times 10^{15}$ atoms/cm$^2$. The angle at which the implant takes place ranges from about 0 degrees to about 7 degrees, and preferably at about 0 degrees from a line perpendicular to the channel direction. The implant carried out at these angles may be defined as a "small-tilt-angle" ion implant. The small-tilt-angle ion implant is performed at least on the edges of the spacers 155 as illustrated by FIG. 18, but may also be introduced by way of a different location. Mask 164 is then stripped using a suitable technique.

Another mask also typically photoresist 172 now protects the NMOS devices, and exposes the source/drain regions for the PMOS devices as illustrated by FIG. 18. A P+ type impurity 174 is implanted at a small-tilt-angle into the source/drain region 180 of the PMOS device. The dose of the P+ type impurities ranges from about $3 \times 10^{15}$ atoms/cm$^2$ and about $5 \times 10^{15}$ atoms/cm$^2$, and is preferably at about $4 \times 10^{15}$ atoms/cm$^2$. A P− type impurity implants into an LDD region 182 underlying both the gate electrode and sidewall spacers by use of the large-tilt-angle ion plant process. The dose at which the large-tilt-angle implant takes place often ranges from about $1 \times 10^{13}$ atoms/cm$^2$ and about $3 \times 10^{13}$ atoms/cm$^2$, and is preferably at about $2 \times 10^{13}$ atoms/cm$^2$. The previously N− type blanket implant on the PMOS device region becomes an effective punchthrough stopper 164, typically used to prevent short channel effects. Mask 172 is stripped by way of a conventional technique. The device of FIG. 18 is then annealed to form the CMOS device illustrated by FIG. 11. Other processing steps such as the formation of an interpoly dielectric layer, metallization, surface passivation, and the like, are preformed on the device of FIG. 18. Of course, the remaining process depends upon the particular application.

While the above is a full description of the specific embodiments, various modifications, alternative constructions and equivalents may be used.. For example, while the description above is in terms of an LDD structure in a CMOS integrated circuit device, it would be possible to implement the present invention with BiCMOS, or the like.

Therefore, the above description and illustrations should not be taken as limiting the scope of the represent invention which is defined by the appended claims.

What is claimed is:

1. A semiconductor integrated circuit device comprising:
   a semiconductor substrate, said semiconductor substrate comprising a first upper surface;
   a first well region having first conductivity type impurities defined on said substrate, said first well region comprising:
      a first gate electrode formed overlying a gate dielectric, said gate dielectric layer defined overlying said first upper surface on said first well region, said first gate electrode including a first sidewall spacer formed thereon; and
      a first source/drain region comprising a first LDD region and a first source/drain, said first source/drain having a portion adjacent to said first upper surface, said first source/drain portion adjacent to said first upper surface underlying a portion of said first sidewall spacer, said first LDD region being formed adjacent to said first gate electrode, said first LDD region including a portion adjacent to said first upper surface, said first LDD region portion adjacent to said upper surface having a portion underlying said first gate electrode and a portion underlying said first sidewall spacer;
      wherein said first LDD region portion underlying said first gate electrode is longer in a lateral direction than said first LDD portion underlying said first sidewall spacer; and
   a second well region having second conductivity type impurities defined on said substrate, said second well region comprising:
      a second gate electrode formed overlying a gate dielectric, said gate dielectric defined overlying said second upper surface on said second well region, said second gate electrode including a second sidewall spacer formed thereon;
      a second source/drain region comprising a second LDD region and a second source/drain, said second source/drain having a portion adjacent to said second upper surface, said second source/drain portion adjacent to said second upper surface underlying a portion of said second sidewall spacer, said second LDD region being formed adjacent to said second gate electrode, said second LDD region including a portion adjacent to said second upper surface, said second LDD portion adjacent to said second upper surface having a portion underlying said second gate electrode and a portion underlying said second sidewall spacer;
      a pocket region comprising second conductivity type impurities, said pocket region being defined adjacent to said second source/drain, being defined substantially underlying said second LDD region and being defined substantially away from said second upper surface;
      a channel region comprising first conductivity type impurities formed underlying a portion of said second gate electrode and adjacent to and connected to said second LDD region, said channel region being substantially free from said pocket region; and
      wherein said second LDD region portion underlying said second gate electrode is longer than said second LDD portion underlying said second sidewall spacer.

2. The device of claim 1 wherein said pocket region is a punchthrough stopper.

3. The device of claim 1 wherein said pocket region and said first LDD regions were formed during a same implant step.

4. The device of claim 1 wherein said first conductivity type impurities are a P type and said second conductivity type impurities are an N type.

5. The device of claim 4 wherein said pocket region is said N type.

6. The device of claim 1 wherein said first LDD portion underlying said first gate electrode extends to a length of about 0.09 μm.

7. The device of claim 1 wherein said second LDD portion underlying said second gate electrode extends to a length of about 0.115 μm.

8. A semiconductor integrated circuit, said semiconductor integrated circuit comprising:
   a semiconductor substrate having an upper surface;

a well region defined in said semiconductor substrate;

a gate electrode formed overlying a gate dielectric, said gate dielectric being defined overlying said upper surface on said well region;

a sidewall spacer defined on an edge of said gate electrode and defined overlying a portion of said gate dielectric;

a lightly doped drain (LDD) region formed adjacent to said gate electrode and extending to said upper surface, said LDD region having a portion underlying said gate electrode and a portion underlying said sidewall spacer;

a source/drain region having first conductivity type impurities defined within a portion of said LDD region and extending to said upper surface, said source/drain region having a portion underlying said sidewall spacer and a portion for a source/drain contact;

a channel region having first conductivity type impurities formed underlying a portion of said gate electrode and adjacent to said LDD region; and a pocket region having second conductivity type impurities, said pocket region being defined adjacent to said source/drain region and being defined substantially underlying said LDD region, said pocket region being defined substantially outside said channel region;

wherein said LDD region portion underlying said gate electrode is longer than said LDD portion underlying said sidewall spacer.

9. The circuit of claim 1 wherein said channel region is provided with a length of 0.35 microns and less.

10. The circuit of claim 1 wherein said first conductivity type impurities are P type.

11. The circuit of claim 1 wherein said second conductivity type impurities are N type.

12. The circuit of claim 1 wherein said pocket region is provided during an LDD implant step.

13. The circuit of claim 1 wherein said channel region is substantially free from said pocket region.

14. The circuit of claim 1 wherein said channel region has a length of 0.4 micron and less.

15. The circuit of claim 1 further comprising a second well region of second conductivity type impurities.

16. A CMOS device, said CMOS device comprising:

a semiconductor substrate of first conductivity type impurities;

a well region of second conductivity type impurities defined in said substrate;

a gate electrode formed overlying a gate dielectric on said well region;

a sidewall spacer defined on an edge of said gate electrode;

a lightly doped drain (LDD) region formed adjacent to said gate electrode, said LDD region having a portion underlying said gate electrode and a portion underlying said sidewall spacer;

a source/drain region having second conductivity type impurities defined within a portion of said LDD region, said source/drain region having a portion underlying said sidewall spacer and a portion for a source/drain contact;

a channel region having second conductivity type impurities formed underlying a portion of said second gate electrode and formed adjacent to said LDD portion, said channel region having a channel length of 0.4 micron and less;

a pocket region having first conductivity type impurities, said pocket region defined adjacent to said source/drain region and substantially underlying said LDD region, said pocket region being substantially free from said channel region;

wherein said LDD region portion underlying said gate electrode is laterally longer than said LDD portion underlying said sidewall spacer.

* * * * *